United States Patent
Yasui et al.

(10) Patent No.: US 11,277,126 B2
(45) Date of Patent: Mar. 15, 2022

(54) SWITCHING DEVICE, DRIVING CIRCUIT DEVICE FOR ACTUATORS, ACTUATOR SYSTEM

(71) Applicant: NABTESCO CORPORATION, Tokyo (JP)

(72) Inventors: Tsutomu Yasui, Tokyo (JP); Takayuki Jinno, Tokyo (JP)

(73) Assignee: NABTESCO CORPORATION, Tokyo (JP)

(*) Notice: Subject to any disclaimer, the term of this patent is extended or adjusted under 35 U.S.C. 154(b) by 0 days.

(21) Appl. No.: 16/898,993

(22) Filed: Jun. 11, 2020

(65) Prior Publication Data

US 2020/0395931 A1 Dec. 17, 2020

(30) Foreign Application Priority Data

Jun. 12, 2019 (JP) .............................. JP2019-109525

(51) Int. Cl.
  *H03K 17/687* (2006.01)
  *H03K 17/30* (2006.01)
  (Continued)

(52) U.S. Cl.
  CPC .......... *H03K 17/302* (2013.01); *G05F 1/595* (2013.01); *G05F 3/18* (2013.01); *H02M 1/08* (2013.01);
  (Continued)

(58) Field of Classification Search
  CPC .... H03K 17/06; H03K 17/063; H03K 17/145; H03K 17/16; H03K 17/161;
  (Continued)

(56) References Cited

U.S. PATENT DOCUMENTS

2014/0082829 A1* 3/2014 Volmer ................. H02H 9/008
                                                      2/410
2018/0175853 A1* 6/2018 Curbow ............... H03K 17/165

FOREIGN PATENT DOCUMENTS

JP     2001217697 A     8/2001
JP     2005191676 A     7/2005
(Continued)

OTHER PUBLICATIONS

JPO Notice of Reasons for Refusal corresponding to JP Patent Appln. No. 2017-109525; date dispatched: Aug. 27, 2019.
(Continued)

*Primary Examiner* — Long Nguyen
(74) *Attorney, Agent, or Firm* — Cantor Colburn LLP (57) ABSTRACT

A switching device includes: a lower switching element, an upper switching element having a source connected to a drain of the lower switching element; a control circuit including a first output part that supplies a driving signal to the lower switching element; a Zener diode having a cathode connected to the first output part; a parallel capacitor connected to the Zener diode in parallel; a resistor connected between an anode of the Zener diode and a gate of the lower switching element; and a gate-side capacitor provided separate from a parasitic capacitance of the lower switching element, having a larger capacitance than the parasitic capacitance of the lower switching element, and connected, outside the lower switching element, between the gate and a source of the lower switching element. The capacitance of the gate-side capacitor is smaller than a capacitance of the parallel capacitor.

8 Claims, 5 Drawing Sheets

(51) Int. Cl.
*G05F 1/595* (2006.01)
*G05F 3/18* (2006.01)
*H02M 1/08* (2006.01)
*H02P 27/06* (2006.01)
*H03K 17/0812* (2006.01)
*H03K 17/74* (2006.01)

(52) U.S. Cl.
CPC ....... *H02P 27/06* (2013.01); *H03K 17/08122* (2013.01); *H03K 17/6871* (2013.01); *H03K 17/74* (2013.01)

(58) Field of Classification Search
CPC ............... H03K 17/162; H03K 17/163; H03K 17/08122; H03K 17/302; H03K 17/687; H03K 17/6871; H03K 17/74; H03K 19/00346; H03K 19/00361; G05F 1/595; G05F 3/18; H02M 1/08; H02P 27/06
See application file for complete search history.

(56) References Cited

FOREIGN PATENT DOCUMENTS

| | | | |
|---|---|---|---|
| JP | 2010161496 A | 7/2010 | |
| JP | 2014171276 A | 9/2014 | |
| WO | WO 2018047689 A1 * | 3/2015 | .............. H02M 1/08 |
| WO | 2017216974 A1 | 12/2017 | |
| WO | 2018047689 A1 | 3/2018 | |
| WO | 2018112302 A1 | 6/2018 | |

OTHER PUBLICATIONS

JPO Notice of Reasons for Refusal corresponding to JP Patent Appln. No. 2017-109525 date dispatched: Jan. 21, 2020.
EPO Extended European Search Report for EP Patent Application No. 20179220.7; Date Received: Oct. 22, 2020.

* cited by examiner

SWITCHING DEVICE, DRIVING CIRCUIT DEVICE FOR ACTUATORS, ACTUATOR SYSTEM

CROSS REFERENCE TO RELATED APPLICATIONS

The present invention claims priority under 35 U.S.C. § 119 to Japanese Application No. 2019-109525 filed Jun. 12, 2019, the entire contents of which are incorporated herein by reference.

BACKGROUND OF THE INVENTION

1. Field of the Invention

The present invention relates to a switching device, a driving circuit device for actuators, and an actuator system.

2. Description of the Related Art

Devices provided with a totem-pole switching circuit are known. The circuit includes an upper arm switching element and a lower arm switching element connected vertically. For example, patent literature 1 discloses an inverter circuit for subjecting a three-phase coil of an electric motor to PWM driving. The inverter circuit includes a tote-pole circuit that combines an upper arm switching element and a lower arm switching element. The circuit is provided with a bootstrap circuit that turns on the upper arm switching element by using a capacitor.

[Patent literature 1] JP-2018-064322

We have gained the following recognition about devices provided with a switching circuit. In the case of a totem-pole switching circuit having upper and lower switching elements, one should be mindful of occurrence of parasitic turn-on caused by parasitic capacitance or floating capacitance. When the upper switching element is turned on while the lower switching element is off, for example, the gate potential of the lower switching element increases via the parasitic capacitance. When the gate potential exceeds a threshold value, the lower switching element is turned on (hereinafter, called "self turn-on"), causing a short-circuit current to flow in the upper and lower switching elements.

To reduce the switching loss of switching elements, it is conceivable to employ a switching element capable of high-speed switching. A problem with the use of a high-speed switching element is that the lower switching element is turned on in a short period of time since the gate potential increases so that a short circuit of the upper and lower switching elements due to self turn-on occurs easily.

SUMMARY OF THE INVENTION

Based on the foregoing, we have realized that there is room for improvement in devices provided with a switching circuit from the perspective of reducing the occurrence of self turn-on.

The present invention addresses the above-described issue, and a general purpose thereof is to provide a switching device capable of inhibiting self turn-on.

A switching device according to an embodiment of the present invention includes: a lower switching element, a drain of the lower switching element outputting a switch driving signal; an upper switching element having a source connected to the drain of the lower switching element; a control circuit including an output part that supplies a driving signal to the lower switching element; a Zener diode having a cathode connected to the output part; a parallel capacitor connected to the Zener diode in parallel; a resistor connected between an anode of the Zener diode and a gate of the lower switching element; and a gate-side capacitor provided separate from a parasitic capacitance of the lower switching element, having a larger capacitance than the parasitic capacitance of the lower switching element, and connected, outside the lower switching element, between the gate and a source of the lower switching element. The capacitance of the gate-side capacitor is smaller than a capacitance of the parallel capacitor.

Optional combinations of the aforementioned and replacement of constituting elements or implementation of the present invention in the form of methods, devices, programs, transitory or non-transitory recording mediums storing programs, systems, etc. may also be practiced as optional modes of the present invention.

DETAILED DESCRIPTION OF THE INVENTION

The invention will now be described by reference to the preferred embodiments. This does not intend to limit the scope of the present invention, but to exemplify the invention.

The present invention will be described based on preferred embodiments with reference to the drawings. In the embodiments and variations, the same or equivalent constituting elements and members shall be denoted by the same reference numerals, and duplicative explanations will be omitted appropriately. The dimension of members in the drawings shall be enlarged or reduced as appropriate to facilitate understanding. Those of the members that are not material to the description of the embodiments are omitted in the drawings.

Terms including ordinal numbers like first and second are used to describe a variety of constituting elements, but those terms are used solely for the purpose of distinguishing one constituting element from another and shall not limit the constituting elements.

First Embodiment

Figure 1:
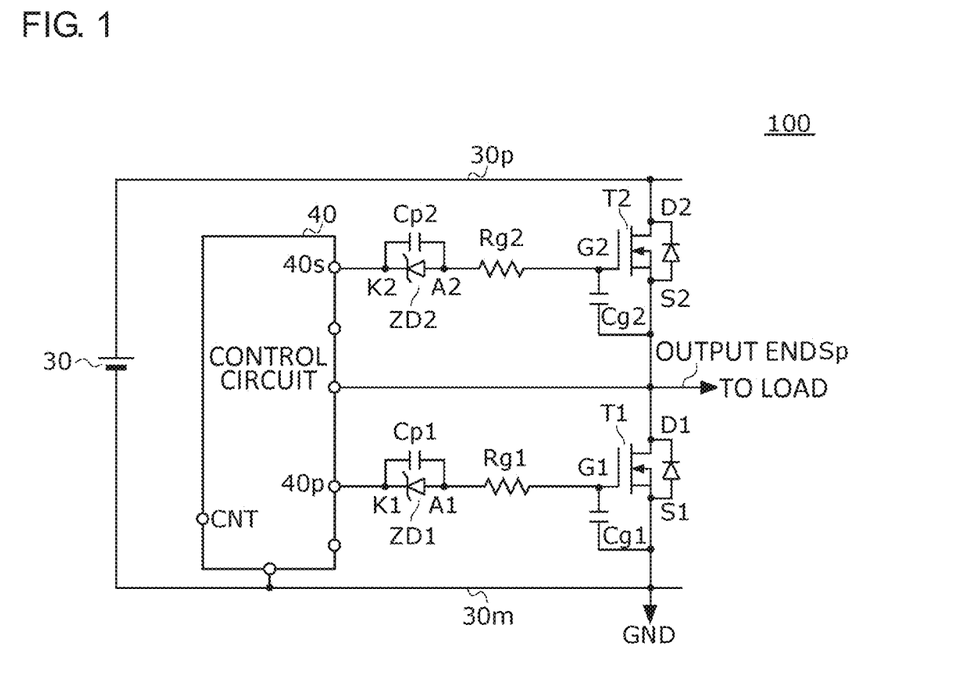
FIG. 1 is a block diagram showing an example of the switching device according to the first embodiment of the present invention.

A description will be given of a configuration of a switching device 100 according to the first embodiment of the present invention with reference to the drawings. The switching device 100 is suitably used to subject a driven object such as an electric actuator to switch driving. In particular, the switching device 100 could be used to subject an actuator for airplanes, for which high reliability is required, to switch driving. FIG. 1 is a block diagram showing an example of the switching device 100 according to the first embodiment. The switching device 100 outputs a switch driving signal from an output end Sp to subject a load (e.g., a coil of an actuator) connected to the output end Sp to switch driving.

The switching device 100 mainly includes a lower switching element T1, an upper switching element T2, a control circuit 40, Zener diodes ZD1, ZD2, parallel capacitors Cp1, Cp2, gate resistors Rg1, Rg2, and gate-side capacitors Cg1, Cg2. Generically, the lower switching element T1 and the upper switching element T2 are simply referred to as switching elements. The switching element may be of any type so long as it is a semiconductor switching element capable of controlling the drain-source conduction state according to the gate voltage.

From the perspective of reducing a switching loss, a silicon carbide-metal-oxide-semiconductor field-effect transistor (SiC-MOSFET) or a gallium nitride-metal-oxide-semiconductor field-effect transistor (GaN-MOSFET) is employed as the switching element of this embodiment. The switching element of FIG. 1 is an n-channel MOSFET. Therefore, the switching element is turned on when the gate voltage is higher than a threshold value and is turned off when the gate voltage is lower than the threshold value.

The lower switching element T1 and the upper switching element T2 have gates G1, G2, sources S1, S2, and drains D1, D2, respectively. The drain D1 of the lower switching element T1 and the source S2 of the upper switching element T2 are connected to each other to form the output end Sp. The source S1 of the lower switching element T1 is connected to a negative side 30m of a DC power supply unit 30. The drain D2 of the upper switching element T2 is connected to a positive side 30p of the DC power supply unit 30. The negative side 30m is so referred to, to mean that the side is negative with respect to the positive side 30p. In the illustrated example of FIG. 1, the negative side 30m is connected to the ground line GND of the switching device 100. The potential of the ground line GND is 0 V. Generically, the gates G1, G2, the source S1, S2, and the drains D1, D2 are simply referred to as gates, sources, and drains.

The control circuit 40 functions as gate driver for outputting a driving signal to the switching elements based on an input signal from a superior system input to an input part CTN. The control circuit 40 according to this embodiment includes a first output part 40p that supplies a driving signal to the lower switching element T1 and a second output part 40s that supplies a driving signal to the upper switching element T2. Generically, the first and second output parts 40p, 40s are simply referred to as output parts. The output part outputs a high level for turning the switching element on and a low level for turning the switching element off. The potential of the high level is set to a height derived from adding the Zener voltage and a certain margin to the turn-on voltage (threshold value) of the switching element. The potential of the low level is set to about 0 V.

The Zener diode ZD1 has a cathode K1 and an anode A1. The cathode K1 of the Zener diode ZD1 is connected to the first output part 40p, and the anode A1 is connected to one end of the gate resistor Rg1. The Zener diode ZD2 has a cathode K2 and an anode A2. The cathode K2 of the Zener diode ZD2 is connected to the second output part 40s, and the anode A2 is connected to one end of the gate resistor Rgs. For example, the Zener voltage Vz of the Zener diodes ZD1, ZD2 may be set in a range of not lower than 1 V and not higher than 5 V.

In this embodiment, no series resistors or parallel resistors are connected to the Zener diodes ZD1, ZD2. The anodes A1, A2 and the cathodes K1, K2 are directly connected to the ends of the parallel capacitors Cp1, Cp2, respectively. In this embodiment, no series resistors or parallel resistors are connected to the parallel capacitors Cp1, Cp2. The ends of the parallel capacitors Cp1, Cp2 are directly connected to the anodes A1, A2 and the cathodes K1, K2, respectively.

The parallel capacitor Cp1 is connected to the Zener diode ZD1 in parallel. The parallel capacitor Cp2 is connected to the Zener diode ZD2 in parallel. The parallel capacitors Cp1, Cp2 operate as a negative voltage generating circuit that generates a negative voltage on the anode side. The Zener diodes ZD1, ZD2 transmit a driving signal of the output part to the gate and clamps the voltage across the parallel capacitors Cp1, Cp2, respectively. Generically, the parallel capacitors Cp1, Cp2 and the Zener diode ZD1 are simply referred to as parallel capacitors and Zener diodes. For example, the capacitance of the parallel capacitors Cp1, Cp2 may be set to a range of not larger than 3 µf. In particular, the capacitance of the parallel capacitors Cp1, C2 is preferably equal to or larger than 0.5 µF, and, more preferably, equal to or larger than 1 µF, and, still more preferably, equal to or larger than 2 µf.

The gate resistor Rg1 is connected between the anode A1 of the Zener diode ZD1 and the gate G1 of the lower switching element T1. The gate resistor Rg2 is connected between the anode A2 of the Zener diode ZD2 and the gate G2 of the upper switching element T2. Generically, the gate resistor Rg1 and the gate resistor Rg2 are simply referred to as gate resistors. The gate resistor can adjust the switching speed of the switching element. The larger the gate resistance, the lower the switching speed, and the smaller the gate resistance, the higher the switching speed. For example, the resistance value of the gate resistors Rg1, Rg2 may be set to be 200Ω or smaller. In particular, the resistance value of the gate resistors Rg1, Rg2 is preferably 10Ω or larger, and, more preferably, 30Ω or larger, and, still more preferably, 100Ω or larger.

The gate-side capacitor Cg1 is connected between the gate G1 and the source S1 of the lower switching element T1. The gate-side capacitor Cg1 is provided outside the lower switching element T1 apart from the gate G1-source S1 parasitic capacitance inside the lower switching element T1. The capacitance of the gate-side capacitor Cg1 may be larger than the gate G1-source S1 parasitic capacitance. In particular, the capacitance of the gate-side capacitor Cg1 is preferably 10 times or larger, and, more preferably, 100 times or larger, and, still more preferably, 1000 times or larger than the gate G1-source S1 parasitic capacitance.

The gate-side capacitor Cg2 is connected between the gate G2 and the source S2 of the upper switching element T2. The gate-side capacitor Cg2 is provided outside the upper switching element T2 apart from the gate G2-source S2 parasitic capacitance inside the upper switching element T2. The capacitance of the gate-side capacitor Cg2 may be larger than the gate G2-source S2 parasitic capacitance. In particular, the capacitance of the gate-side capacitor Cg2 is preferably 10 times or larger, and, more preferably, 100 times or larger, and, still more preferably, 1000 times or larger than the gate G2-source S2 parasitic capacitance.

Generically, the gate-side capacitors Cg1, Cg2 are referred to as gate-side capacitors. The gate-side capacitor absorbs the current flowing into the gate due to the parasitic capacitance and inhibits an increase in the gate voltage. The capacitance of the gate-side capacitor may be set to be larger than the parasitic capacitance. For example, the capacitance of the gate-side capacitors Cg1, Cg2 may be set in a range of not larger than 2000 PF. In particular, the capacitance of the gate-side capacitors Cg1, Cg2 is preferably 500 PF or larger, and, more preferably, 1000 PF or larger.

The time constant defined by the gate resistor Rg1 and the gate-side capacitor Cg1 is preferably 5 ns or longer, and, more preferably, 15 ns or longer, and, still more preferably, 50 ns or longer. The time constant defined by the gate resistor Rg2 and the gate-side capacitor Cgs is preferably 5 ns or longer, and, more preferably, 15 ns or longer, and, still more preferably, 50 ns or longer.

Figure 2:
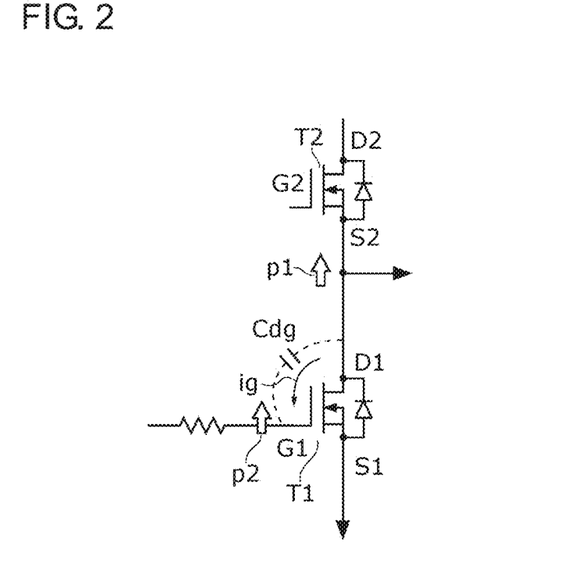
FIG. 2 illustrates self turn-on of the switching device according to a comparative example.

A description will now be given, with reference also to FIG. 2, of self turn-on in a comparative example in which the parallel capacitor Cp1 and the Zener diode ZD1 are removed. FIG. 2 illustrates self turn-on in a comparative example. When the second output part 40s goes to a high level, the upper switching element T2 is turned on, and the potential at the drain D1 as well as the source S2 rises abruptly, as indicated by an arrow p1. When the potential at the drain D1 rises, a current ig is injected to the gate G1 of the lower switching element T1 via a drain-source parasitic capacitance Cdg of the lower switching element T1. When the current ig is injected, the potential at the gate G1 rises, as indicated by an arrow p2. When the potential at the gate G1 exceeds a threshold value, the lower switching element T1 undergoes self turn-on, and a short circuit current flows in the upper and lower switching elements.

Figure 3:
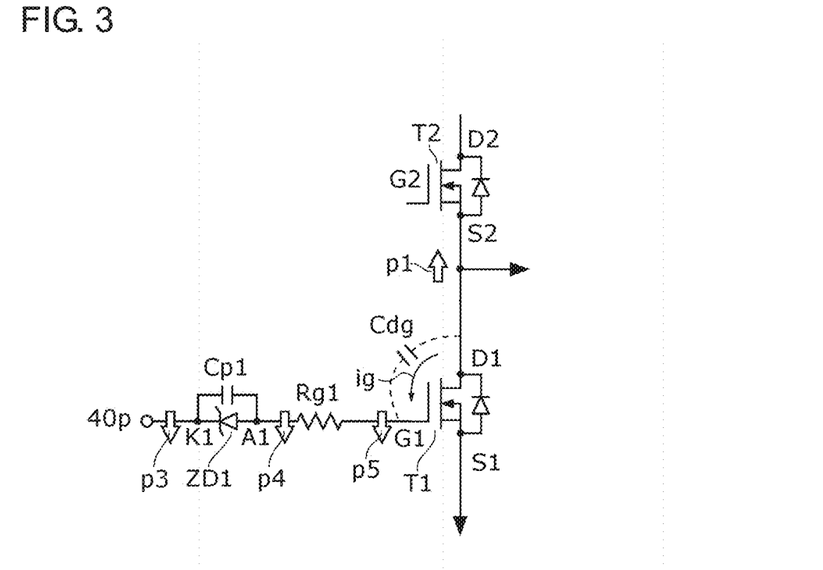
FIG. 3 illustrates the operation of the switching device of FIG. 1.

Based on the description of the comparative example, the operation according to this embodiment will be described. Reference is also made to FIG. 3. FIG. 3 illustrates the operation of the switching device 100. A description will be given here of a case of switching from the initial first state (the lower switching element T1 is on, and the upper switching element T2 is off) to the second state (the lower switching element T1 is off, and the upper switching element T2 is on). The switching is performed in response to a change in an input signal to an input part CNT of the control circuit 40.

In the first state, the first output part 40p of the control circuit 40 outputs a high level, and the second output part 40s outputs a low level. When the first output part 40p is at a high level, a voltage lower by the Zener voltage Vz than the high level potential is applied to the gate G1 of the lower switching element T1. In this process, the charge commensurate with the Zener voltage Vz is stored in the parallel capacitor Cp1. When the second output part 40s is at a low level, substantially 0 V is applied to the gate G2, and the upper switching element T2 is off.

When an input signal for switching to the second state is input to the control circuit 40, the first output part 40p of the control circuit 40 changes to a low level, and the second output part 40s changes to a high level. When the second output part 40s changes to a high level, a voltage lower by the Zener voltage Vz than the high level potential is applied to the gate G2 of the upper switching element T2, and the upper switching element T2 is turned on. When the upper switching element T2 is turned on, the potential at the drain D1 as well as the source S2 rises abruptly, as indicated by an arrow p1. When the potential at the drain D1 rises, a current ig is injected to the gate G1 of the lower switching element T1 via the drain-gate parasitic capacitance Cdg. However, the parallel capacitor Cp1 operates as a negative voltage generating circuit and prohibits self turn-on by absorbing the injected current.

A description will be given of the negative voltage generating circuit. When the first output part 40p changes to a low level as indicated by an arrow p3, the side of the parallel capacitor Cp1 toward the first output part 40p is shifted to substantially 0 V. In this process, the side of the parallel capacitor Cp1 toward the gate resistor Rg1 is shifted to a voltage (negative voltage) lower by the Zener voltage Vz than 0 V, as indicated by an arrow p4. As a result, the negative voltage is applied to the gate G1 of the lower switching element T1 as indicated by an arrow p5. In other words, the parallel capacitor Cp1 and the Zener diode ZD1 prevent self turn-on of the lower switching element T1 from occurring even when the current ig is injected via the parasitic capacitance Cdg, allowing the lower switching element T1 to be turned off in a short period of time. As the lower switching element T1 is turned off, the second state is induced.

A description will now be given of a case of switching from the second state to the first state. The switching is performed in response to a change in an input signal to the input part CNT of the control circuit 40.

In the second state, the second output part 40s of the control circuit 40 outputs a high level, and the first output part 40p outputs a low level. When the second output part 40s is at a high level, a voltage lower by the Zener voltage Vz than the high level potential is applied to the gate G2 of the upper switching element T2. In this process, the charge commensurate with the Zener voltage Vz is stored in the parallel capacitor Cp2. When the first output part 40p is at a low level, substantially 0 V is applied to the gate G1, and the lower switching element T1 is off.

When an input signal for switching from the second state to the first state is input to the input part CNT, the second output part 40s of the control circuit 40 changes to a low level, and the first output part 40p changes to a high level. When the first output part 40p changes to a high level, a voltage by the Zener voltage Vz lower than the high level potential is applied to the gate G1 of the lower switching element T1, and the lower switching element T1 is turned on. When the lower switching element T1 is turned on, the potential at the source S2 as well as the drain D1 drops abruptly. When the potential at the source S2 drops, a current is injected to the gate G2 of the upper switching element T2 via the drain-gate parasitic capacitance. However, the parallel capacitor Cp2 operates as a negative voltage generating circuit and prohibits self turn-on by absorbing the injected current.

When the second output part 40s changes to a low level, the side of the parallel capacitor Cp2 toward the second output part 40s is shifted to substantially 0 V, and the side of the parallel capacitor Cp2 toward the gate resistor Rg2 is shifted to a voltage (negative voltage) lower by the Zener voltage Vz than 0 V. As a result, the negative voltage is applied to the gate G2 of the upper switching element T2. In other words, the parallel capacitor Cp2 and the Zener diode ZD2 prevent self turn-on of the upper switching element T2 from occurring even when a current is injected via the parasitic capacitance, allowing the upper switching element T2 to be turned off in a short period of time. As the upper switching element T2 is turned off, the first state is induced.

Thus, the negative voltage generating function of the parallel capacitor and the Zener diode prevents self turn-on of the switching elements in a transition between the first state and the second state.

A further description of the Zener diode will be given. When the gate potential of the switching element drops excessively relative to the source potential, the switching element may be damaged, and a fault may occur. For this reason, the Zener voltage Vz of the Zener diodes ZD1, ZD2 is set to restrict excessive drop of the gate potential in this embodiment. In particular, the Zener voltage Vz may be set to be lower than a permitted value of the gate-source voltage Vgs of the switching elements T1, T2 in the negative direction (the value permitted in the case the gate potential is negative relative to the source potential. In this example, the permitted value of the voltage Vgs in the negative direction is 5 V, and the Zener voltage Vz is set to 3 V.

A further description will be given of the gate-side capacitors Cg1, Cg2. If the capacitance of the gate-side capacitors Cg1, Cg2 is too large, the switching speed of the switching elements T1, T2 is lowered. For this reason, the capacitance of the gate-side capacitors Cg1, Cg2 is set to be lower than the parallel capacitors Cp1, Cp2 in this embodiment. For example, the capacitance of the parallel capacitors Cp1, Cp2 may be set to be in a range of 500 times-2000 times the capacitance of the gate-side capacitors Cg1, Cg2.

A description will now be given of the features of the switching device 100 according to the first embodiment.

A switching device 100 includes: a lower switching element T1, a drain of the lower switching element outputting a switch driving signal; an upper switching element T2 having a source S2 connected to the drain D1 of the lower switching element T1; a control circuit 40 including a first output part 40p that supplies a driving signal to the lower switching element T1; a Zener diode ZD1 having a cathode K1 connected to the first output part 40p; a parallel capacitor Cp1 connected to the Zener diode ZD1 in parallel; a gate resistor Rg1 connected between an anode A1 of the Zener diode ZD1 and a gate G1 of the lower switching element T1; and a gate-side capacitor Cg1 connected between the gate G1 and a source S1 of the lower switching element T1.

According to this configuration, it is possible to prevent self turn-on of the lower switching element T1 caused by the parasitic capacitance or the floating capacitance and to avoid a short circuit due to simultaneous turn-on of the upper and lower switching elements T2 and T1.

The control circuit may include a second output part 40s that supplies a driving signal to the upper switching element T2, and the switching device may further include: a further Zener diode ZD2 having a cathode K2 connected to the second output part 40s; a further parallel capacitor Cp2 connected to the further Zener diode ZD2 in parallel; a further resistor Rg2 connected between an anode A2 of the further Zener diode ZD2 and a gate G2 of the upper switching element T2; and a further gate-side capacitor Cg2 connected, outside the upper switching element T2, between the gate G2 and the source S2 of the upper switching element T2. In this case, it is possible to prevent self turn-on of the upper switching element T2 caused by the parasitic capacitance or the floating capacitance and to avoid a short circuit due to simultaneous turn-on of the upper and lower switching elements T2 and T1.

The lower switching element T1 and the upper switching element T2 may be SiC-MOSFETs or GaN-MOSFETs. In this case, it is possible to inhibit an increase in the loss occurring when the switching elements are switched at a high speed.

A Zener voltage of the Zener diode ZD1 may be set to be lower than a permitted value of a gate-source voltage of the lower switching element T1 in a negative direction. In this case, it is possible to prevent a voltage in excess of the permitted value from being applied to the lower switching element T1 and to prevent a fault of the switching element.

The capacitance of the gate-side capacitor Cg1 may be smaller than a capacitance of the parallel capacitor Cp1. In this case, it is possible to inhibit the switching speed of the lower switching element T1 from being lowered.

Second Embodiment

Figure 4:
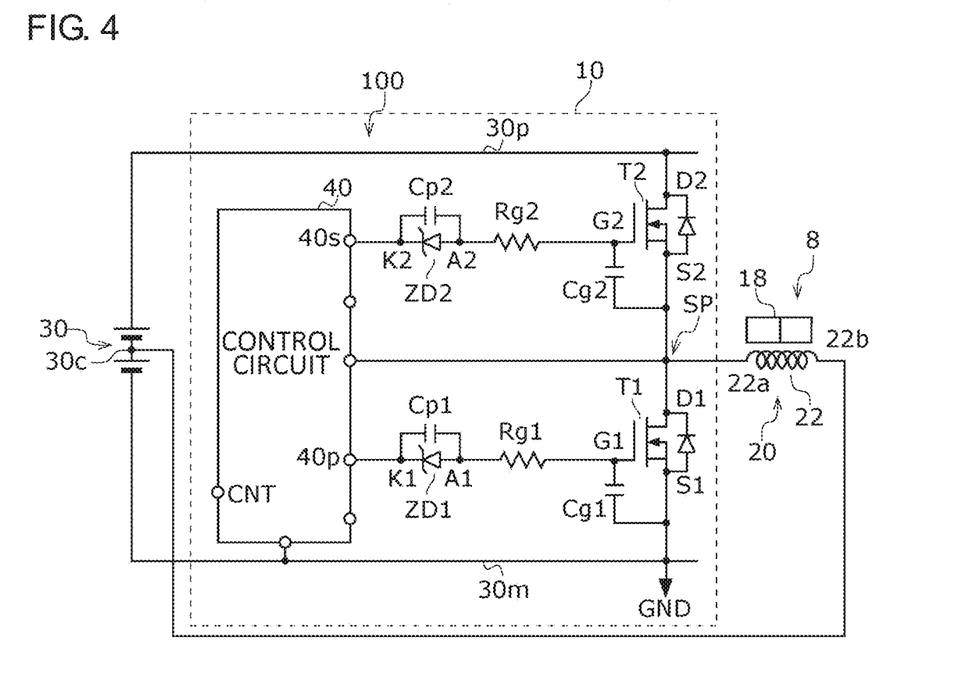
FIG. 4 is a block diagram showing an example of the driving circuit device for actuators according to the second embodiment of the present invention.

A description will now be given of a driving circuit device 10 for actuators according to the second embodiment of the present invention. FIG. 4 is a block diagram showing an example of the driving circuit device 10 for actuators. In the drawing and description of the second embodiment, constituting elements and members identical or equivalent to those of the first embodiment shall be denoted by the same reference numerals. Duplicative explanations are omitted appropriately and features different from those of the first embodiment will be highlighted.

The driving circuit device 10 includes the switching device 100 according to the first embodiment and drives an actuator 8. In the example of FIG. 4, the actuator 8 is a linear motor including a stator 20 having a one-phase armature coil 22, and a movable part 18 capable of linear motion relative to the stator 20. This embodiment is provided with the switching device 100 for driving one end 22a of the armature coil 22. The other end 22b of the armature coil 22 is connected to a midpoint 30c of the DC power supply unit 30. By way of one example, the actuator 8 may be a linear motor of voice coil type.

A description will be given of the operation. When a switching signal is input to the input part CNT of the control circuit 40, the switching device 100 subjects the coil 22 to switch driving based on the switching signal. This induces a driving current in the coil 22 and supplies a driving magnetic field to the movable part 18. The movable part 18 outputs a driving force in accordance with the driving magnetic field.

This embodiment provide the same advantage and benefit as the first embodiment.

Third Embodiment

Figure 5:
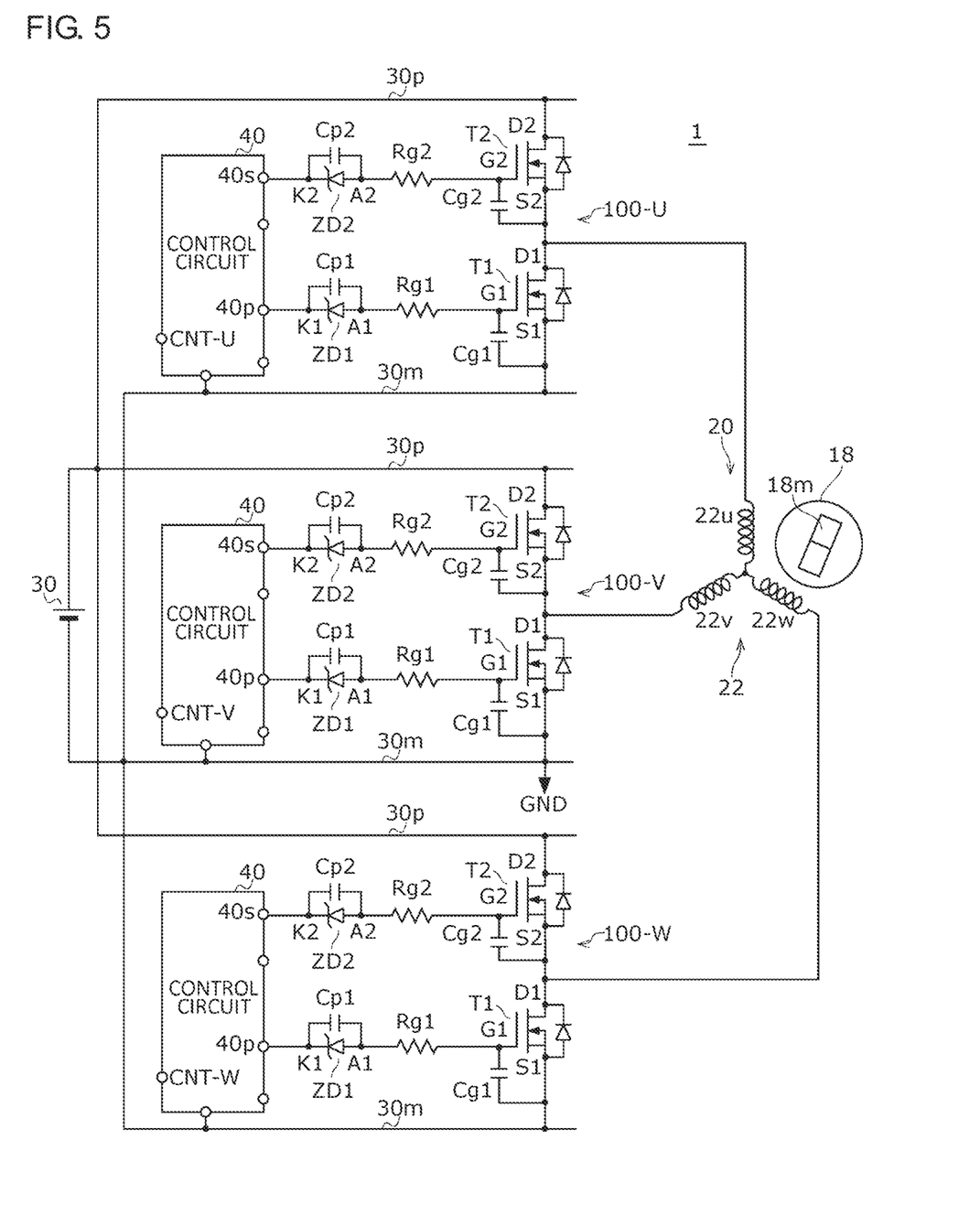
FIG. 5 is a block diagram showing an example of the actuator system according to the third embodiment of the present invention.

A description will now be given of an actuator system 1 according to the third embodiment of the present invention. FIG. 5 is a block diagram showing an example of the actuator system 1. In the drawing and description of the third embodiment, constituting elements and members identical or equivalent to those of the first embodiment shall be denoted by the same reference numerals. Duplicative explanations are omitted appropriately and features different from those of the first embodiment will be highlighted.

The actuator system 1 includes the switching devices 100 according to the first embodiment, the stator 20 having the armature coil 22, and the movable part 18 provided such that rotational motion or linear motion relative to the stator 20 is possible. The movable part 18 and the stator 20 constitute an actuator. In FIG. 5, the plurality of switching devices 100 are discriminated from each other by appending "-U", "-V", "-W" at the end of the reference numerals.

In the example of FIG. 5, the stator 20 includes a three-phase armature coil 22. The armature coil 22 includes three coils 22u, 22v, 22w in three-phase star connection. This embodiment includes three sets of switching devices 100-U, 100-V, 100-W that drive the three coils 22u, 22v, 22w, respectively. The movable part 18 may be a rotor wrapped around the stator 20 via a magnetic gap (not shown). By way of one example, the movable part 18 and the stator 20 may be an interior permanent magnet (IPM) motor.

A description will now be given of the operation. When a switching signal for three-phase driving is input to input parts CNT-U, CNT-V, CNT-W of the control circuit 40, the switching devices 100-U, 100-V, 100-W subject the coils 22u, 22v, 22w to switch driving based on the switching signal, respectively. This causes a three-phase driving current to flow in the coils 22u, 22v, 22w and supplies a driving magnetic field in the magnetic gap. The movable part 18 outputs a driving force in accordance with the driving magnetic field.

This embodiment provide the same advantage and benefit as the first embodiment.

Exemplary embodiments of the present invention are described above in detail. The embodiments described above are merely specific examples of practicing the present invention. The details of the embodiments shall not be construed as limiting the technical scope of the present invention. A number of design modifications such as modification, addition, deletion, etc. of constituting elements may be made to the extent that they do not depart from the idea of the invention defined by the claims. Although the details subject to such design modification are emphasized in the embodiments by using phrases such as "of this embodiment" and "in this embodiment", details not referred to as such are also subject to design modification.

Variations

A description will now be given of variations. In the drawings and description of the variations, constituting elements and members identical or equivalent to those of the embodiments shall be denoted by the same reference numerals. Duplicative explanations are omitted appropriately and features different from those of the first embodiment will be highlighted.

First Variation

Figure 6:
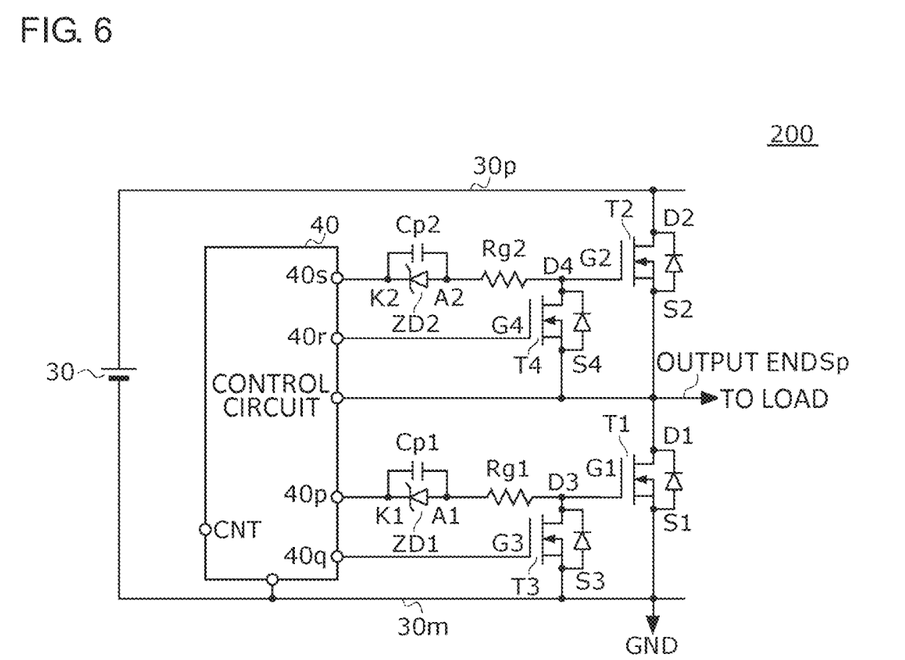
FIG. 6 is a block diagram showing the switching device according to the first variation.

A description will be given of a configuration of a switching device 200 according to the first variation based on the first embodiment. FIG. 6 is a block diagram showing the switching device 200 according to the first variation and corresponds to FIG. 1. The switching device 200 according to the first variation differs from the first embodiment in that Miller clamp switching elements T3, T4 are provided in place of the gate-side capacitors Cg1, Cg2, and the other features are analogous to each other. Therefore, the switching elements T3, T4 will be described mainly.

In the first variation, the Miller clamp switching elements T3, T4 are provided in place of the gate-side capacitors Cg1, Cg2. To turn the switching elements T1, T2 off, the control circuit 40 lowers the potential at the gates G1, G2 of the switching elements T1, T2 by turning the Miller clamp switching elements T3, T4 on, respectively.

In the example of FIG. 6, drains D3, D4 of the switching elements T3, T4 are connected to the gates G1, G2 of the switching elements T1, T2, respectively. Sources S3, S4 of the switching elements T3, T4 are connected to the ground line GND. The sources S3, S4 of the switching elements T3, T4 may be connected to the sources S1, S2 of the switching elements T1, T2, respectively.

The control circuit 40 includes an inverted output part 40q that supplies an inverted version of a first driving signal to the gate G3 of the switching element T3 and an inverted output part 40r that supplies an inverted version of a second driving signal to the gate G4 of the switching element T4.

The inverted output parts 40q, 40r output inverted versions of the output signals of the first and second output parts 40p, 40s, respectively. In other words, when the first and second output parts 40p, 40s are at a high level, the inverted output parts 40q, 40r output a low level. When the first and second output parts 40p, 40s are at a low level, the inverted output parts 40q, 40r output a high level. When the inverted output parts 40q, 40r are at a high level, the switching elements T3, T4 are turned on. The drains D3, D4 bypass the gate resistors Rg1, Rg2, lowering the potential at the gates G1, G2 positively and preventing self turn-on of the switching elements T1, T2, respectively.

The switching elements T3, T4 may be of the same type as the switching element T1, T2 or may be of a different type. The switching elements T3, T4 according to this variation are n-channel MOSFETs having a current capacity smaller than that of the switching elements T1, T2. A low speed of the switching elements T3, T4 results in poor self turn-on prevention performance. For this reason, SiC-MOSFET or GaN-MOSFET capable of high-speed operation are employed for the switching elements T3, T4 according to this variation. In the example of FIG. 6, the further Zener diode ZD2 may be omitted.

The first variation provides the same advantage and benefit as the first embodiment. A further advantage of the first variation is that reduction in the speed of the switching elements T1, T2 due to the gate-side capacitors Cg1, Cg2 hardly occurs so that the switching loss is reduced.

In the first variation, the turn-on delay time of the switching elements T3, T4 may be shorter than the turn-on delay time of the switching elements T1, T2 from the perspective of lowering the potential at the gates G1, G2 of the switching elements T1, T2 promptly. In particular, the turn-on delay time of the switching elements T3, T4 may be preferably 50% or shorter, and, more preferably, 30% or shorter, and, still more preferably, 20% or shorter than the turn-on delay time of the switching elements T1, T2.

Second Variation

Figure 7:
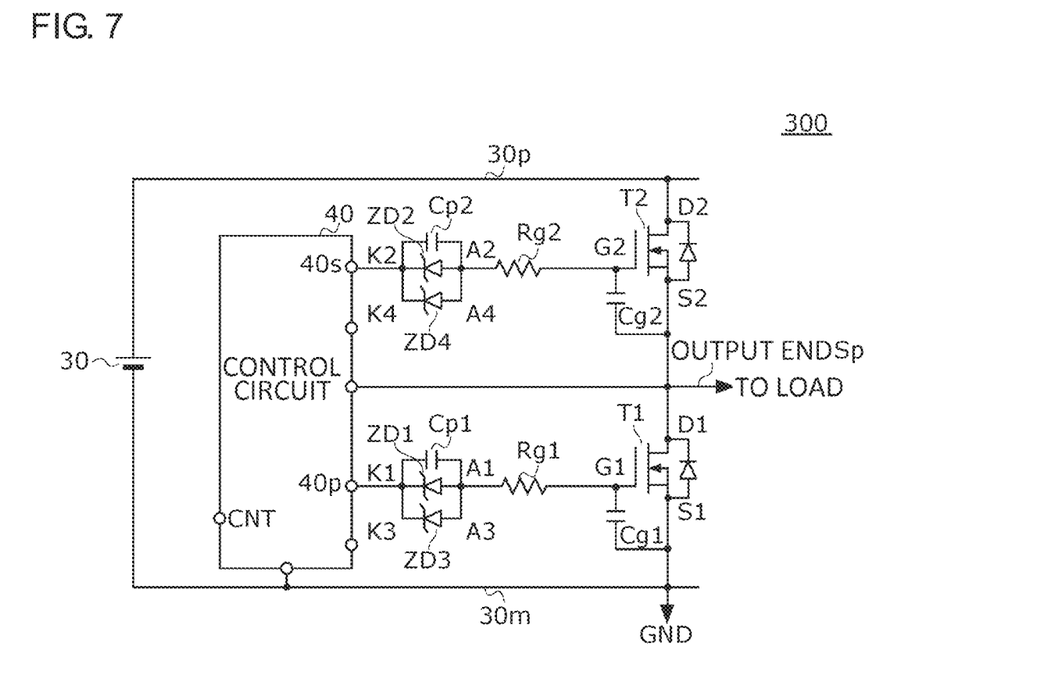
FIG. 7 is a block diagram showing the switching device according to the second variation.

A description will be given of a configuration of a switching device 300 according to the second variation based on the first embodiment. FIG. 7 is a block diagram showing the switching device 300 according to the second variation and corresponds to FIG. 1. The switching device 300 according to the second variation differs from the first embodiment in that the device includes a parallel Zener diode ZD3 connected to the Zener diode ZD1 in parallel such that the cathodes thereof are connected to each other and includes and a parallel Zener diode ZD4 connected to the Zener diode ZD2 in parallel such that the cathodes thereof are connected to each other. The other features are analogous to each other. Therefore, the parallel Zener diodes ZD3, ZD4 will be described mainly.

When an open fault of one of the Zener diodes ZD1, ZD2 occurs, the voltage of the parallel capacitor Cp1 or Cp2 is no longer restricted, which may apply an excessively low potential to the gate of the switching element, with the result that the switching element may be damaged, and a fault may occur. This is addressed in this variation by providing the parallel Zener diodes ZD3, ZD4. As shown in FIG. 7, anodes A3, A4 of the parallel Zener diodes ZD3, ZD4 are connected to the anodes A1, A2 of the Zener diodes ZD1, ZD2, respectively, and cathodes K3, K4 of the parallel Zener diodes ZD3, ZD4 are connected to the cathodes K1, K2 of the Zener diodes ZD1, ZD2, respectively.

In other words, the parallel Zener diode ZD3 operates in the same manner as the Zener diode ZD1, and the parallel Zener diode ZD4 operates in the same manner as the Zener diode ZD2.

The second variation provides the same advantage and benefit as the first embodiment. A further advantage of the second variation is that, when an open fault of one of the Zener diodes ZD1 and the parallel Zener diode ZD3 occurs, the other fulfils the function. Similarly, when an open fault occurs in one of the Zener diode ZD2 and the parallel Zener diode D4 occurs, the other fulfils the function. By causing one to back up the other in the event of a fault, the switching device 300 can be made redundant.

In the second variation, the Zener voltage of the parallel Zener diode ZD3 may be set to be higher than the Zener voltage of the Zener diode ZD1. By way of one example, the Zener voltage of the parallel Zener diode ZD3 may be set to be higher by 1 V or more than the Zener voltage of the Zener diode ZD1.

When a failure does not occur in either of the diodes, the current flows in the Zener diode ZD1 having a relatively lower Zener voltage and does not substantially flow or rise in the parallel Zener diode ZD3, hardly causing degradation of the parallel Zener diode ZD3. For this reason, the parallel Zener diode ZD3, which is not substantially degraded, can back up in the event of a fault in the Zener diode ZD1.

A concern with too large a Zener voltage of the parallel Zener diode ZD3 is that it cannot restrict the voltage of the parallel capacitor Cp1. In this respect, the difference between the Zener voltage of the parallel Zener diode ZD3 and the Zener voltage of the Zener diode ZD1 is preferably 3 V or smaller, and, more preferably, 2 V or smaller.

The same discussion as set forth above for the Zener voltage of the parallel Zener diode ZD3 also applies to the Zener voltage of the parallel Zener diode ZD4. By way of one example, the Zener voltage of the parallel Zener diode ZD4 may be set to be higher by 1 V or more than the Zener voltage of the Zener diode ZD2. Further, the difference between the Zener voltage of the parallel Zener diode ZD4 and the Zener voltage of the Zener diode ZD2 is preferably 3 V or smaller, and, more preferably, 2 V or smaller.

Other Variations

In the description of the first embodiment, the switching elements T1-T4 are described as being n-channel MOSFETs. Alternatively, the switching elements may be p-channel MOSFETs.

In the description of the first embodiment, the switching device 100 is described as being driven by a single power supply. Alternatively, the switching device 100 may be driven by a dual power supply.

In the description of the third embodiment with reference to FIG. 5, the plurality of switching devices 100 are described as being controlled by a plurality of independent control circuits 40. Alternatively, the plurality of switching devices may be controlled by a single control circuit.

The variations described above provide the same advantage and benefit as the embodiments.

Any combination of an embodiment and a variation described above will also be useful as an embodiment of the present invention. A new embodiment created by a combination will provide the combined advantages of the embodiment and the variation as combined.

What is claimed is:

1. A switching device comprising:
a lower switching element, a drain of the lower switching element outputting a switch driving signal;
an upper switching element having a source connected to the drain of the lower switching element;
a control circuit including an output part that supplies a driving signal to the lower switching element;
a Zener diode having a cathode connected to the output part;
a parallel capacitor connected to the Zener diode in parallel;
a resistor connected between an anode of the Zener diode and a gate of the lower switching element; and
a gate-side capacitor provided separate from a parasitic capacitance of the lower switching element, having a larger capacitance than the parasitic capacitance of the lower switching element, and connected, outside the lower switching element, between a connection point between the gate and the resistor and a source of the lower switching element, wherein
the capacitance of the gate-side capacitor is smaller than a capacitance of the parallel capacitor.

2. The switching device according to claim 1, wherein
the control circuit includes a further output part that supplies a further driving signal to the upper switching element;
the switching device further comprising:
a further Zener diode having a cathode connected to the further output part;
a further parallel capacitor connected to the further Zener diode in parallel;
a further resistor connected between an anode of the further Zener diode and a gate of the upper switching element; and
a further gate-side capacitor connected, outside the upper switching element, between the gate and the source of the upper switching element, wherein
a capacitance of the further gate-side capacitor is smaller than a capacitance of the further parallel capacitor.

3. The switching device according to claim 2, wherein
the capacitance of the parallel capacitor is set to be in a range of 500 times-2000 times the capacitance of the gate-side capacitor, and the capacitance of the further parallel capacitor is set to be in a range of 500 times-2000 times the capacitance of the further gate-side capacitor.

4. The switching device according to 1, wherein
the lower switching element and the upper switching element are SiC-MOSFETs or GaN-MOSFETs.

5. The switching device according to claim 1, further comprising:
a parallel Zener diode connected to the Zener diode such that cathodes of the Zener diode and the parallel Zener diode are connected to each other.

6. The switching device according to claim 1, wherein
a Zener voltage of the Zener diode is set to be lower than a permitted value of a gate-source voltage of the lower switching element in a negative direction.

7. A driving circuit device comprising:
an output end connected to an armature coil of an electric actuator;
a lower switching element having a drain connected to the output end;
an upper switching element having a source connected to the drain of the lower switching element;

a control circuit including an output part that supplies a driving signal to the lower switching element and a further output part that supplies a further driving signal to the upper switching element;

a Zener diode having a cathode connected to the output part;

a parallel capacitor connected to the Zener diode in parallel;

a resistor connected between an anode of the Zener diode and a gate of the lower switching element; and a gate-side capacitor provided separate from a parasitic capacitance of the lower switching element, having a larger capacitance than the parasitic capacitance of the lower switching element, and connected, outside the lower switching element, between a connection point between the gate and the resistor and a source of the lower switching element, wherein the capacitance of the gate-side capacitor is smaller than a capacitance of the parallel capacitor.

8. An actuator system comprising:

an electric actuator including an armature coil;

a lower switching element having a drain connected to the armature coil of the electric actuator;

an upper switching element having a source connected to the drain of the lower switching element;

a control circuit including an output part that supplies a driving signal to the lower switching element and a further output part that supplies a further driving signal to the upper switching element;

a Zener diode having a cathode connected to the output part;

a parallel capacitor connected to the Zener diode in parallel;

a resistor connected between an anode of the Zener diode and a gate of the lower switching element; and a gate-side capacitor provided separate from a parasitic capacitance of the lower switching element, having a larger capacitance than the parasitic capacitance of the lower switching element, and connected, outside the lower switching element, between a connection point between the gate and the resistor and a source of the lower switching element, wherein the capacitance of the gate-side capacitor is smaller than a capacitance of the parallel capacitor.

* * * * *